(12) United States Patent
Lai et al.

(10) Patent No.: US 6,333,959 B1
(45) Date of Patent: Dec. 25, 2001

(54) CROSS FEEDBACK LATCH-TYPE BI-DIRECTIONAL SHIFT REGISTER IN A DELAY LOCK LOOP CIRCUIT

(75) Inventors: Steven Lai, Milpitas; Je-Hurn Shieh, Cupertino, both of CA (US)

(73) Assignee: Winbond Electronics Corporation, Hsin-Chu (TW)

( * ) Notice: Subject to any disclaimer, the term of this patent is extended or adjusted under 35 U.S.C. 154(b) by 0 days.

(21) Appl. No.: 09/557,521

(22) Filed: Apr. 25, 2000

(51) Int. Cl.$^7$ .................................................. G11C 19/00
(52) U.S. Cl. ................................................. 377/69; 377/77
(58) Field of Search .................................. 377/69, 77, 79, 377/80

(56) References Cited

U.S. PATENT DOCUMENTS 5,481,749 * 1/1996 Grondalski .............................. 377/64

OTHER PUBLICATIONS

Shim, D. et al., "An Analog Synchronous Mirror Delay for High–Speed DRAM Application", *IEEE Jr. of Solid–State Circuits*, vol. 34, No. 4, Apr. 1999.
Saeki, T, et al., "A Direct–Skew–Detect Synchronous Mirror Delay for Application–Specific Integrated Circuits", *IEEE Jr. of Solid–State Circuits*, vol. 34, No. 4, Mar. 1999.
Kim, C.H. et al., "A 64–Mbit, 640–MByte/s Bidirectional Data Strobed, Double–Data–Rate SDRAM with a 40–nW DDL for a 256–MByte Memory System", *IEEE Jr. of Solid–State Circuits*, vol. 33, No. 11, Nov. 1998.
Lin, F., et al., "A Register–Controlled Symmetrical DLL for Double–Data–Rate DRAM" *IEEE Jr. of Solid–State Circuits*, vol. 34, No. 4, Apr. 1999.
Saeki, T. et al., "A 2.5–ns Clock Access, 250–MHx, 256–Mb SDRAM with Synchronous Mirror Delay" *IEEE Jr. of Solid–State Circuits*, vol. 31, No. 11, Nov. 1996.
Hatakeyama, A., et al., "A 256–Mb SDRAM Using a Register–Controlled Digital DLL" *IEEE Jr. of Solid–State Circuits*, vol. 32, No. 11, Nov. 1997.

* cited by examiner

*Primary Examiner*—Margaret R. Wambach
(74) *Attorney, Agent, or Firm*—Burns, Doane, Swecker & Mathis, L.L.P.

(57) ABSTRACT

A simplified bi-directional shift register and a single-latch circuit for implementing the bi-directional shift register thereof which obviates the use of a conventional dual-latch (i.e., master/slave) configuration in the bi-directional shift register design is described. The single-latch circuit includes an input circuit portion and a latching circuit portion. The input circuit portion receives input signals including the output data from previous and next single-latch circuits in the shift register and right shift and left shift control signals. Dependent on the input signals, the input circuit portion drives an input node coupled to the latching circuit portion with a data value to be shifted which corresponds to data from one of the previous and next single-latch circuits. The latching circuit portion includes a tri-state inverter which is responsive to the system clock signal such that when the clock signal transitions to a given state, the data value to be shifted is latched to the output of the single-latch circuit wherein the shift operation is performed. A delay lock loop circuit implemented with a bi-directional shift register designed with the single-latch circuit has reduced size and minimized noise due to the simplicity of the single-latch circuit.

20 Claims, 7 Drawing Sheets

CROSS FEEDBACK LATCH-TYPE BI-DIRECTIONAL SHIFT REGISTER IN A DELAY LOCK LOOP CIRCUIT

BACKGROUND OF THE INVENTION

1. Field of the Invention

The present invention relates to the delay lock loop (DLL) circuit in a double data rate (DDR) synchronous dynamic random access memory (SDRAM), and more particularly to the shift register portion of the DLL circuit.

2. State of the Art

In a synchronous dynamic random access memory (SDRAM) system, operations performed within the system, such as read or write operations, are clocked or synchronized to the rising and falling edge of an external system clock. In particular, in a double data rate (DDR) SDRAM system or device, data is clocked out of the device such that it is synchronized with both the rising and falling edge of the external clock. In order to implement this type of synchronization, a delay lock loop (DLL) circuit is used.

FIG. 1A shows a system block diagram of a SDRAM 10 design including DLL circuitry 11 which in response to external clock 11A provides an optimum delayed clock signal 11B to the data output buffer 12 such that the data 12A from the DRAM core 13 is output from the buffer 12 on the rising and falling edge of the external clock 11A to provide Output Data signal 12B.

FIG. 1B shows a basic prior art digital DLL circuit 14 including an input receiver buffer 15 for receiving an external clock signal 15A and providing an internal clock signal 15B to a delay unit circuit 16. The delay unit circuit 16 is programmably adjustable by a digital state stored within a shift register 17 to provide a variable time delay so as to generate a clock signal 16A that corresponds to the internal clock signal 15B delayed by the amount established within the delay unit circuit. Clock signal 16A is used to clock output buffer 18 such that data from the DRAM core 18A is clocked through buffer 18 on the subsequent rising and falling edges of the external clock signal 16A. The DLL circuit further includes a feedback loop having a Phase Detector 19 which, depending on the phase difference between a feedback clock signal 16A' and the internal clock signal 15B causes the shift register to shift left or right thereby increasing or decreasing, respectively, the delay value stored within shift register 17. Dummy output buffer 20 and Dummy receiver buffer 21 provide a path for feedback Clk signal 16A that is the equivalent to the path for the external clock signal 15A. The delay value stored in register 17 is used to program delay unit circuit 16 such that data 18A is clocked through buffer 18 to the output of the memory device on each of the next rising or falling edge of the external clock signal.

FIG. 1C shows a typical prior art bi-directional shift register usable in the DLL circuit shown in FIG. 1B. The shift register includes a plurality of clocked D-type flip-flops (FF1, FF2 ... FF(n)) and a plurality of multiplexers (MUX1, MUX2 ... MUX(n))—one coupled to the input of each latch. Each multiplexer passes data from the output of either the previous or next flip-flop within the shift register to the input of its corresponding flip-flop to perform either the right or left shift operation. The multiplexers pass the data dependent on the right and left shift control signals provided by the phase detector and coupled to the select input port (S) of each multiplexer in FIG. 1C. The flip-flop is generally edge triggered by the clock signal (CLK) such that on a first clock cycle edge (either rising or falling), the next or previous data passed by the multiplexer is clocked into the flip-flop and on the second clock cycle edge (the same edge as the first cycle) the data is latched to the flip-flop output.

FIG. 1D shows a one prior art design of a D type flip-flop typically used within the shift register shown in FIG. 1C. The flip-flop is designed with two J-K edge-triggered flip flop latching stages—a master latch and a slave latch. As is well known in digital circuit design, latches are typically implemented with cross-coupled NAND gate circuits as shown in FIG. 1D.

One problem which is encountered when designing a conventional DLL circuit using the shift register as shown in FIG. 1C implemented with the flip-flop as shown in FIG. 1D is that in order to cover a wide operating frequency range while maintaining an acceptable adjustment resolution a large number of individual delay unit elements and an equal number of flip-flops are required within the DLL circuit design. However, increasing the number of delay unit elements and flip-flops increases circuit complexity, size, and power consumption. Moreover, increased complexity, size, and power consumption results in an increase in noise inducement within the DLL circuit during operation and undesirable affects due to noise. For instance, jitter (i.e., signal shifting over time) within the DLL circuit strongly depends on noise coupling within the DLL circuit. Hence, a significant design consideration when designing a DLL circuit is the simplification of the shift register design within the DLL circuit.

What would be desirable is to reduce the complexity of the bi-directional shift register used within a DLL circuit so as to minimize circuit noise and silicon space consumption of the bi-directional shift register. Reducing shift register complexity also allows a more robust delay unit and shift register to be designed into the DLL circuit which can provide increased resolution and reliability.

SUMMARY OF THE INVENTION

A simplified single-latch circuit, a bi-directional shift register implemented with the simplified single-latch circuit thereof, and a delay lock loop (DLL) circuit implemented with a bi-directional shift register thereof is described. Since the bi-directional shift register is designed with a single-latch instead of the conventional dual-latch (i.e., master/slave latches) stage, the size and complexity of the shift register is greatly reduced as well as the noise generated within the DLL circuit.

In one embodiment, a single-latch circuit includes an input circuit portion implemented with a first MOS device having its gate coupled to a first shift control signal line, its source coupled to the output data provided from a previous single-latch circuit and its drain coupled to a first node. The input circuit portion also includes a second MOS device having its gate coupled to a second shift control signal line, its source coupled to the output data provided from a next single-latch circuit and its drain coupled to the first node. The first and second shift control signals cause one of the next and previous output data signals to be driven on the first node which corresponds to a data value to be shifted during a first half cycle of a clock signal. The input circuit portion also includes a positive feedback loop circuit coupled to the first node for holding the state of the data value to be shifted on the input node of a clocked latching circuit portion during the second half of the clock cycle once the first and second devices are disabled by the first and second shift control signals. During a second half cycle of the clock signal the latching circuit portion is clocked "on" and latches the data value to be shifted to the output of the single-latch circuit. The latching circuit portion further includes a second positive feedback loop circuit for holding the logic state of the shifted data value on the output of the single latch circuit once the latching circuit portion is disabled in the subsequent first half of the next clock signal cycle.

In one embodiment, a bi-directional shift register is implemented with a plurality of latching stages, each stage comprising a single-latch circuit having a first input port for receiving the inverse of a first shift control signal, a second input port for receiving a second shift control signal, a third input port for receiving output data from a previous latching stage in the bi-directional shift register, a fourth input port for receiving output data from a next latching stage in the bi-directional shift register, a first clock input port for receiving a system clock signal, a second clock input port for receiving the inverse of the system clock signal, and an output port for outputting a shifted data value. The first latching stage in the register has its third input port coupled to a first working potential and the last latching stage in the register has its fourth input port coupled to a second working potential.

Each single-latch circuit includes an input circuit portion implemented with a first MOS device having its gate coupled to the first input port, its source coupled to the third input port and its drain coupled to a first node. The input circuit portion also includes a second MOS device having its gate coupled to the second input port, its source coupled to the fourth input port and its drain coupled to the first node. During a first half cycle of a clock signal, the first and second shift control signals applied to the first and second input ports cause one of the next and previous output data signals to be driven on the first node which corresponds to a data value to be shifted. The input circuit portion also includes a first positive feedback loop circuit coupled to the first node for holding the state of the data value to be shifted on the input node of a clocked latching circuit portion once the first and second devices are disabled by the first and second shift control signals. During the second half cycle of the clock signal, the latching circuit portion is clocked "on" and latches the data value to be shifted to the output port of the single-latch circuit. The latching circuit portion further includes a second positive feedback loop circuit for holding the logic state of the shifted data value on the output of the single-latch circuit once the latching portion is disabled in the first half of the next clock signal cycle.

In one embodiment, a delay lock loop (DLL) circuit is implemented with a delay unit circuit, a phase detector circuit, and a bi-directional shift register. The delay unit circuit in response to an external clock signal generates a delayed output clock signal corresponding to the external clock signal delayed by the amount of delay time established within the first delay unit circuit by a digital delay value stored within the bi-directional shift register. The phase detector detects any phase difference between the external clock signal and a feedback clock signal which corresponds to the generated delayed output clock signal which has been fed back through the feedback path. During a first half of a clock cycle the phase detector generates right and left shift control signals for controlling the bi-directional register so as to adjust the delay value stored in the register.

The bi-directional shift register includes a plurality of latching stages, each stage comprising a single-latch circuit having a first input port for receiving the inverse of a first shift control signal, a second input port for receiving a second shift control signal, a third input port for receiving output data from a previous latching stage in the bi-directional shift register, a fourth input port for receiving output data from a next latching stage in the bi-directional shift register, a first clock input port for receiving a system clock signal, a second clock input port for receiving the inverse of the system clock signal, and an output port for outputting a shifted data value. The first latching stage in the register has its third input port coupled to a first working potential and the last latching stage in the register has its fourth input port coupled to a second working potential.

Each single-latch circuit includes an input circuit portion implemented with a first MOS device having its gate coupled to the first input port, its source coupled to the third input port and its drain coupled to a first node. The input circuit portion also includes a second MOS device having its gate coupled to the second input port, its source coupled to the fourth input port and its drain coupled to the first node. During a first half cycle of a clock signal, the first and second shift control signals applied to the first and second input ports cause one of the next and previous output data signals to be driven on the first node which corresponds to a data value to be shifted. The input circuit portion also includes a first positive feedback loop circuit coupled to the first node for holding the state of the data value to be shifted on the input node of a clocked latching circuit portion once the first and second devices are disabled by the first and second shift control signals. During the second half cycle of the clock signal, the latching circuit portion is clocked "on" and latches the data value to be shifted to the output port of the single-latch circuit. The latching circuit portion further includes a second positive feedback loop circuit for holding the logic state of the shifted data value on the output of the single-latch circuit once the latching portion is disabled in the subsequent first half of the next clock signal cycle.

BRIEF DESCRIPTION OF THE DRAWINGS

The present invention may be further understood from the following written description in conjunction with the appended drawings. In the drawings.

DETAILED DESCRIPTION OF THE PREFERRED EMBODIMENTS

In the foregoing description, numerous specific details are set forth, such as specific digital elements in order to provide a thorough understanding of the present invention. It will be apparent, however, to one skilled in the art that these specific details need not be employed to practice the present invention. In other instances, well known synchronous memory system theory have not been described in order to avoid unnecessarily obscuring the present invention.

Figure 2:
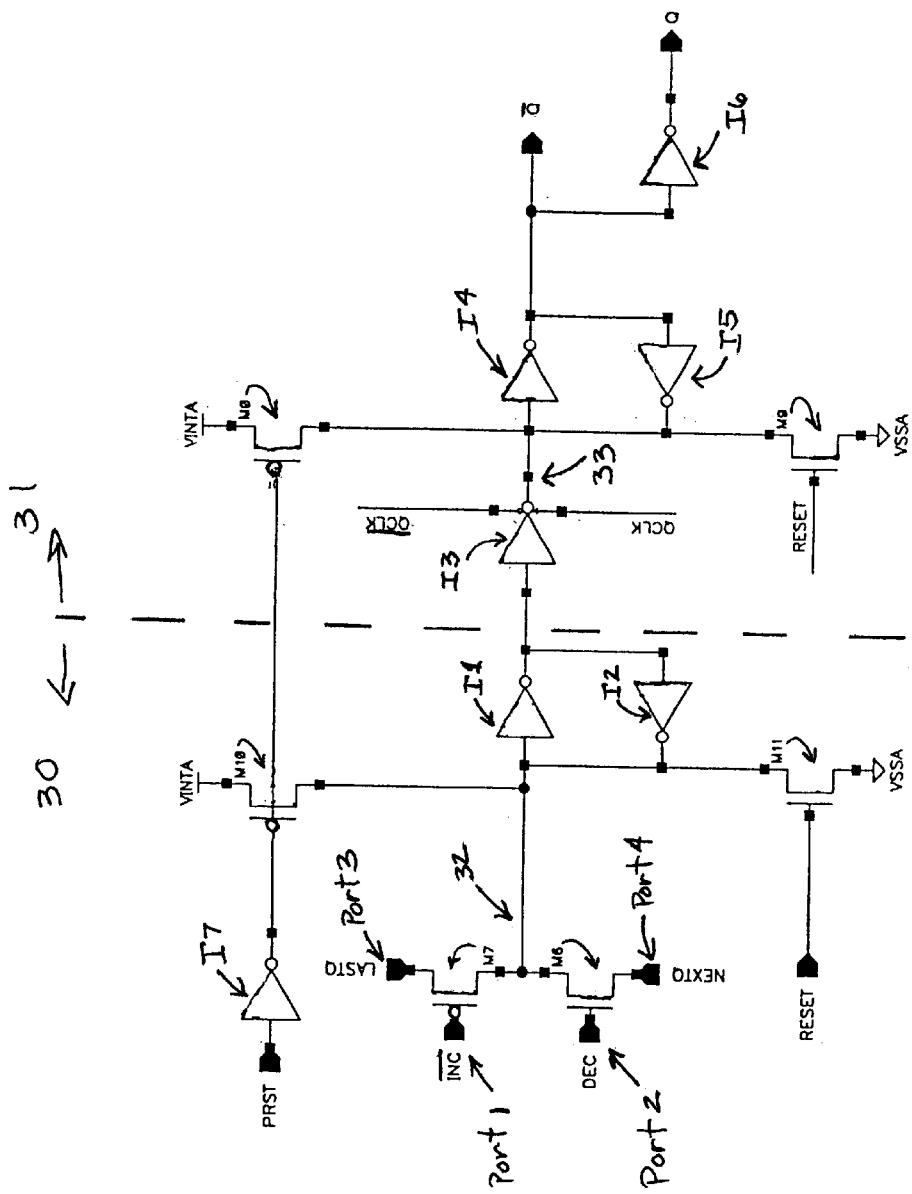
FIG. 2 shows an embodiment of the single-latch circuit in accordance with the present invention for implementing a simplified bi-directional shift register.

FIG. 2 shows one embodiment of a single-latch circuit for implementing within a bi-directional shift register. The single-latch circuit includes an input circuit portion 30 and a clocked latching circuit portion 31.

Input circuit portion 30 includes PMOS device M7 having its gate coupled to the inverse of a first shift control signal (INC/), its source coupled to the output data from the previous single-latch circuit (LASTQ), and its drain coupled to node 32. Also coupled to node 32 is NMOS device M6 having its gate coupled to a second shift control signal (DEC), its source to the output data from the next single-latch circuit (NEXTQ), and its drain coupled to node 32.

During a first half cycle of a clock signal of a system clock one or the other of the PMOS device M7 and the NMOS device M6 is enabled and during a second half of the clock cycle both of devices M7 and M6 are disabled. Specifically, when INC="1" and DEC="0" then M7 is on and M6 is off such that node 32 is driven with the data (LASTQ) applied to Port 3. Alternatively, when INC="0" and DEC="1" then M7 is off and M6 is on such that node 32 is driven with the data (NEXTQ) applied to Port 4. The condition of INC=DEC="1" is not allowed. The condition of INC=DEC="0" disables both M6 and M7.

The single-latch circuit includes a pre-set circuit portion including PMOS devices M10 and M0. In the pre-set state, when PRST="1" then PMOS devices M10 and M0 are enabled. In addition, DEC is held low and INC/ is held high such that both of devices M6 and M7 are off. As a result, voltage VINTA="1" is driven onto nodes 32 and 33 and Q is pre-set to "1". When PRST="0" the pre-set circuit portion is disabled.

The single-latch circuit further includes a reset circuit portion including NMOS devices M11 and M9. In the reset state, when RESET="1" devices M11 and M9 are enabled. As a result, voltage VSSA="0" is driven onto nodes 32 and 33 and Q is reset to "0" no matter what signals are applied to PMOS device M7 and NMOS device M6. When RESET="0", then the reset circuit portion is disabled.

Node 32 is coupled to the input of a clocked latching means (i.e., tri-state inverter I3) through a positive feedback inverter loop circuit including inverter I1 and feedback inverter I2. A positive feedback inverter loop is a bi-stable circuit (i.e., two-state circuit) which provides a stable/low noise input voltage for coupling to the input of tri-state inverter I3. The positive feedback loop functions to hold the digital logic state determined by input signals DEC, INC/, RST, and PRST to the input of the tri-state inverter I3 even after devices M6, M7, M10, and M11 are turned off.

Tri-state inverter I3 is coupled to a system clock signal and the inverse of the system clock signal. In operation, during the second half cycle of the clock signal of the system clock signal QCLK="1" and QCLK/="0" such that the tri-state inverter I3 is enabled and the data value to be shifted on its input (provided by the positive feedback loop I1/I2) is inverted and passed to the latch's output Q and Q/ through a positive feedback loop (inverters I4 and I5) and (in the case of Q) through inverter I6. During the first half of the next clock signal cycle, QCLK="0" and QCLK/="1" such that and tri-state inverter I3 is disabled. The positive feedback loop I4/I5 functions to hold and drive the shifted logic state value on outputs Q and Q/ after the tri-state inverter I3 is disabled during the first half of the next clock signal cycle.

Figure 1A:
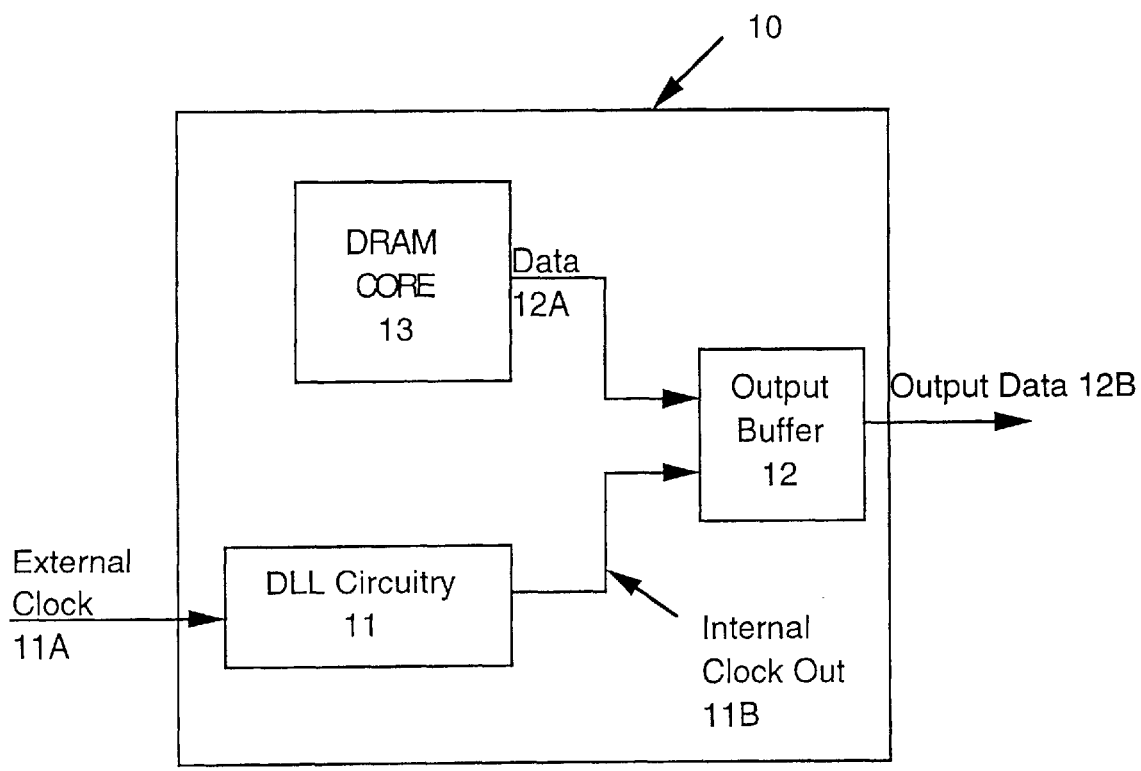
FIG. 1A shows a conventional system block diagram of a SDRAM including DLL circuitry.
Figure 1B:
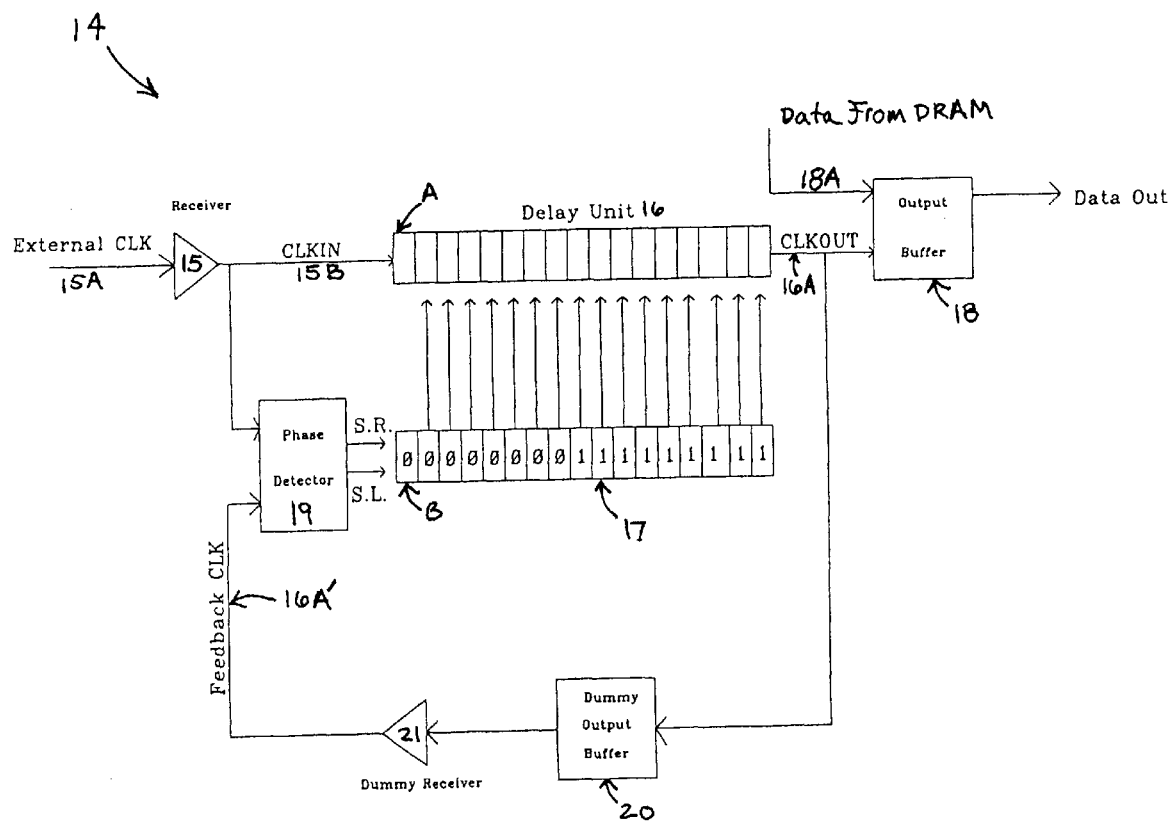
FIG. 1B shows a conventional DLL circuit.
Figure 1C:
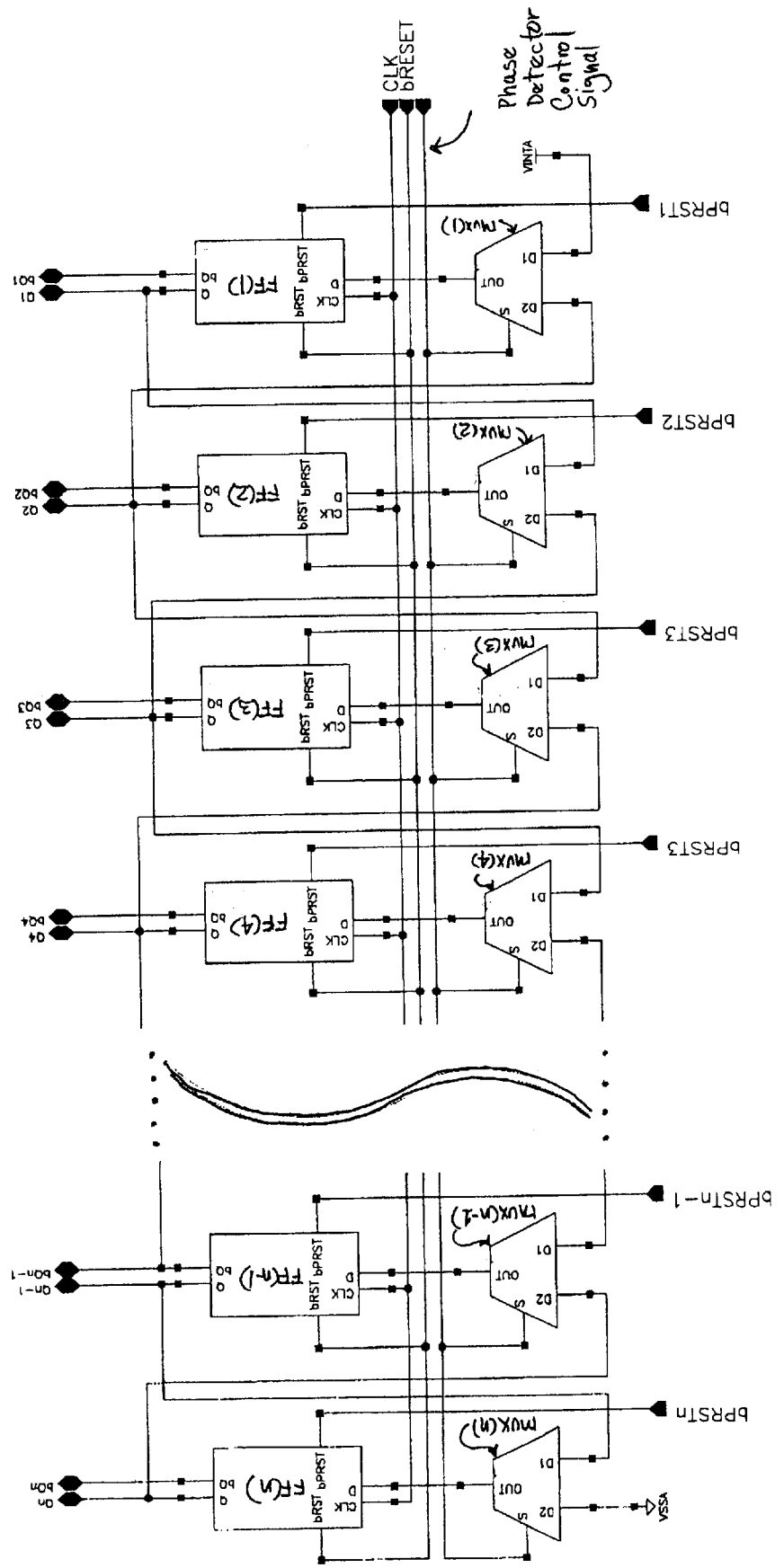
FIG. 1C shows a conventional bi-directional shift register design.
Figure 1D:
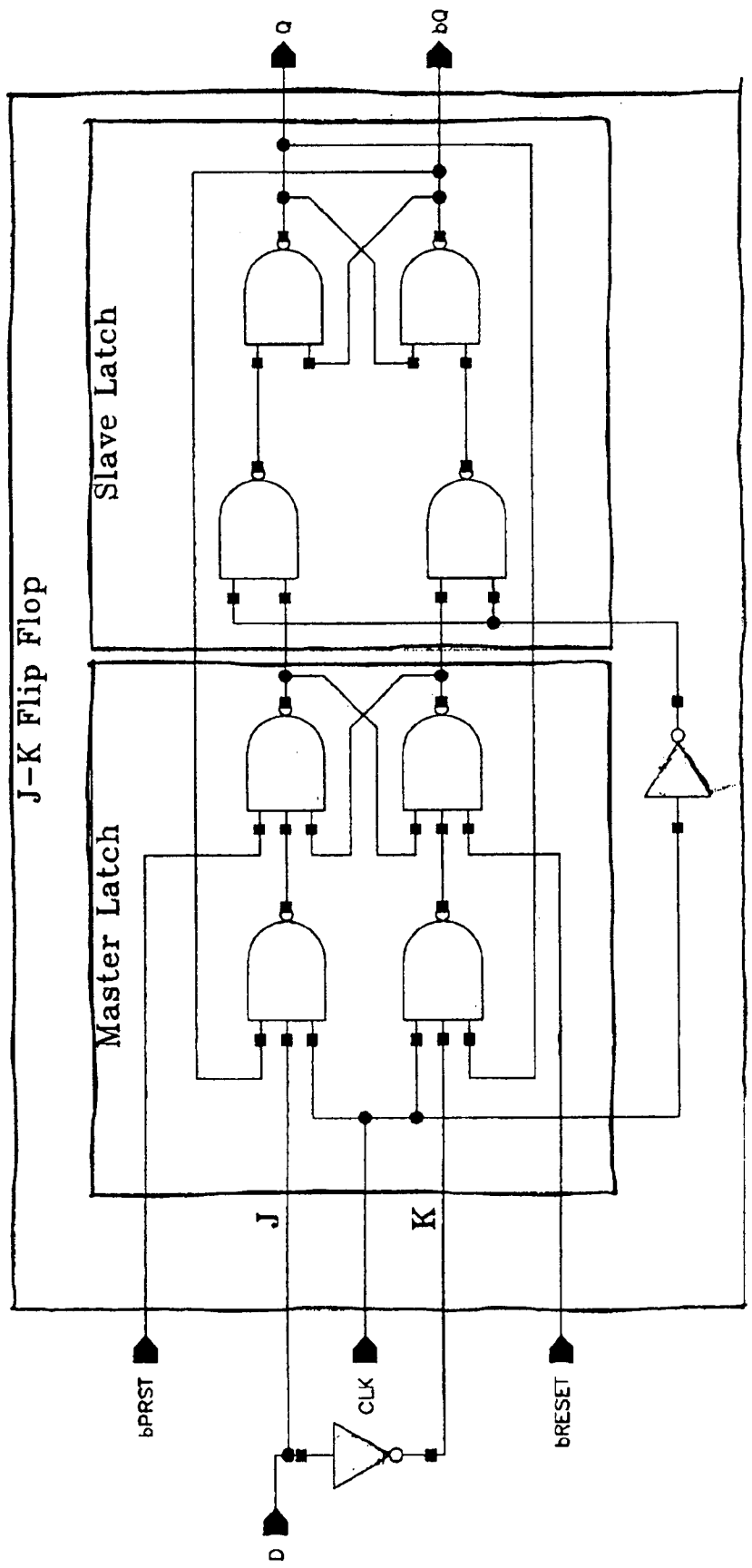
FIG. 1D shows a conventional D-type flip-flop design used within the conventional bi-directional shift register shown in FIG. 1C.

The advantages of the single-latch circuit over prior art flip-flop stages used in conventional bi-directional shift registers as shown in FIGS. 1C and 1D are several. First, prior-art flip-flop stages conventionally use a dual-latch master/slave latch and multiplexer configuration which consumes a large amount of silicon space per flip-flop stage. In contrast, the single-latch circuit as shown in FIG. 2 can be substituted for the flip-flop stage such that it obviates the need for the multiplexer and is implemented with a single latch instead of two latches, thereby greatly reducing the silicon space consumed by a bi-directional shift register implemented with the single-latch circuit shown in FIG. 2.

In addition, due to the complexity of the design of the prior art bi-directional shift register designed with the conventional flip-flop configuration, the shift register tended to create noise that degraded the operation of the delay lock loop (DLL) circuit that it was utilized in. However, due to the simplified design of the single-latch circuit shown in FIG. 2, noise generation from a bi-directional shift register implemented with the single-latch circuit is minimized.

It should be understood that although the single-latch circuit shown in FIG. 2 includes a preset circuit portion and a reset circuit portion these elements are not required to implement the single-latch circuit shown in FIG. 2 and are instead included to provide additional functionality and performance to the basic operation of the single-latch circuit.

Figure 3:
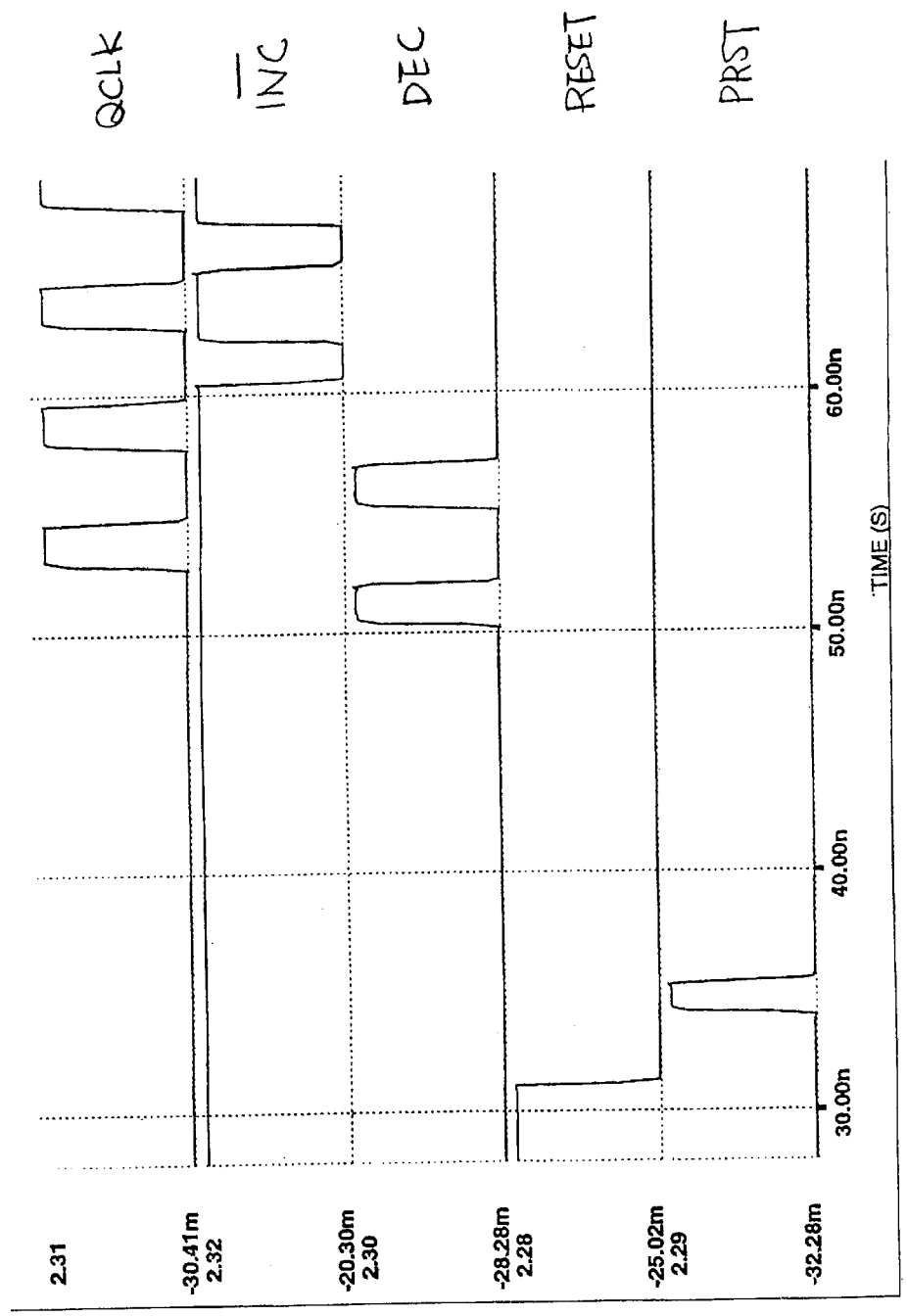
FIG. 3 shows a timing diagram of the operation of the latch shown in FIG. 2.

FIG. 3 shows a timing diagram of the operation of the single-latch circuit shown in FIG. 2. It should be noted that control signals DEC, INC/, PRST and QCLK and QCLK/ do not overlap. In other words, DEC is not switched to a high state (i.e., a decrement command) at the same time that QCLK is in a high state and QCLK/ is in a low state. Similarly, INC/ is not switched to a low state (i.e., an increment command) at the same time that QCLK is in a high state and QCLK/ is in a low state. Similarly, the PRST control signal does not transition high while DEC is high, QCLK is high, QCLK/ is low, or INC/ is low. In addition, a high DEC command will not occur at the same time as a low INC/ command. In other words, during the first half of the clock cycle the input portion is enabled while the latching potion is disabled and control signals are applied and stabilized. During the second half of the clock cycle the input portion is disabled while the latching portion is enabled and latches the shifted data value to the output of the single-latch circuit.

In normal operation within a DLL circuit (i.e., other than during preset and reset condition) during the first half cycle of the clock signal (i.e., rising edge of the clock cycle), if the phase detector detects phase differences, it provides either a decrement control signal or an increment control signal by causing either DEC or INC to transition high, respectively. If the DEC control signal transitions high, then node 32 is driven with the output shift value Q from the next latch (QNEXT). If the INC control signal transitions high, then node 32 is driven with the output shift value Q from the previous latch (QLAST). During the second half cycle of the system clock signal (i.e., the falling edge of the clock cycle), the DEC and INC signals are both low such that both of devices M6 and M7 are off and QCLK is high and the tri-state inverter I3 is enabled by the QCLK and bQCLK signals (note: QCLK is 180 degrees phase shifted from the system clock (CLOCK) which clocks the phase detector). The positive feedback loop I1/I2 holds the shift value from the first half of the clock cycle onto the input of the tri-state inverter I3 even though M6 and M7 are switched off in the second half cycle of the clock signal. The tri-state inverter I3 latches the shift value to its output. In the first half of the next clock signal cycle, the tri-state inverter I3 is switched off, and new DEC or INC control signals can be provided from the phase detector. The positive feedback loop I4/I5 continues to hold the shift value to the output of the latch during the first half of the next clock cycle while inverter I3 is disabled. Hence, shift register adjustments are completed in a single clock cycle.

Figure 4:
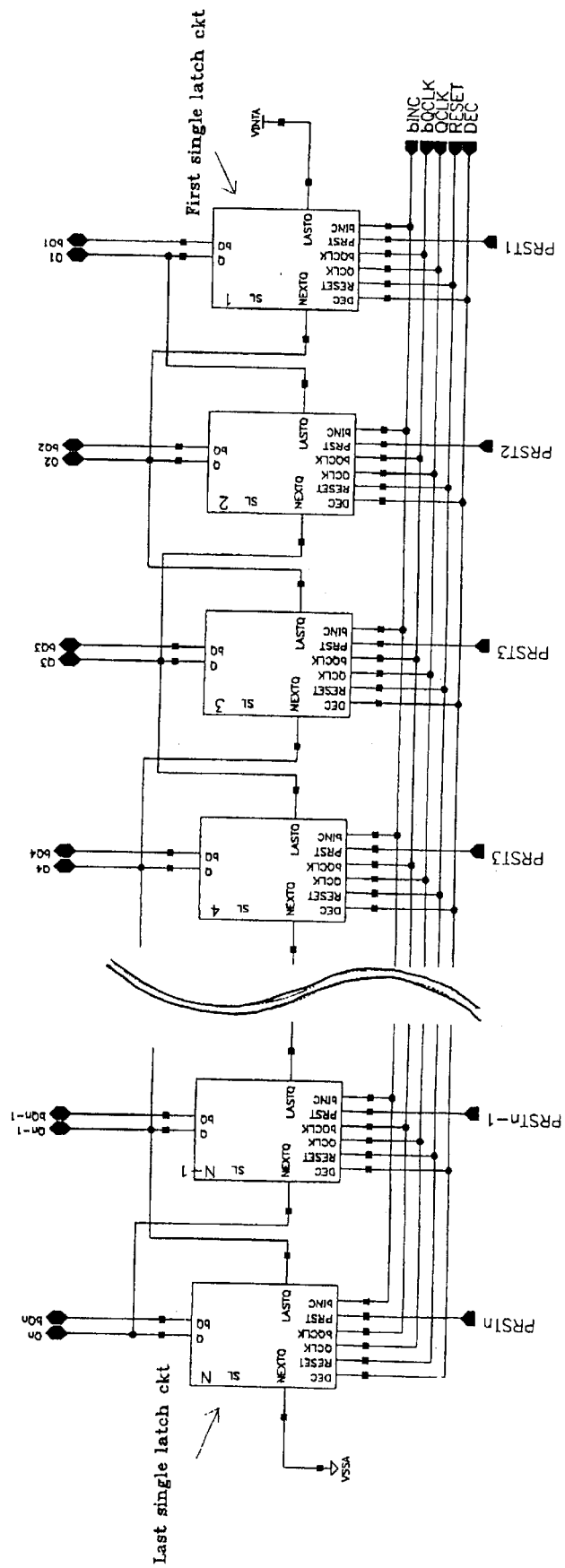
FIG. 4 shows an embodiment of a bi-directional shift register implemented with a plurality of single-latch circuits as shown in FIG. 2.

FIG. 4 shows a bi-directional shift register implemented with a plurality of latching stages SL(1)–SL(N), each stage includes a single-latch circuit having a first input port for receiving the inverse of a first shift control signal (i.e., INC/), a second input port for receiving a second shift control signal (i.e., DEC), a third input port for receiving output data from a previous latching stage in the bi-directional shift register (i.e., LASTQ), a fourth input port for receiving output data from a next latching stage in the bi-directional shift register (i.e., NEXTQ), a first clock input port for receiving a system clock signal (i.e., QCLK), a second clock input port for receiving the inverse of the system clock signal (i.e., QCLK/), and an output port for outputting a shifted data value (i.e., Q).

The latching stages in FIG. 4 are interconnected such that each stage (n) has its LASTQ input port coupled to the output port Q of stage (n−1) and its NEXTQ input port coupled to the output port Q of stage (n+1). Each of the stages has its bINC input port commonly coupled to the bINC input signal and its DEC input port commonly coupled to the DEC input signal such that each stage receives the same left/right control signals. In addition each stage has its QCLK and bQCLK input ports commonly coupled to the QCLK and bQCLK input signals such that each stage is clocked simultaneously. Each stage has its RESET input port commonly coupled to the same RESET signal such that when the shift register is reset all of the stages are reset. Finally, the PRST input ports of each stage are coupled to independent preset signals (PRST(1)–PRST(n)) so that each can be preset individually.

Also shown in FIG. 4 is the first latch stage SL(1) has its LASTQ input port coupled to a fixed high logic level voltage, VINTA, so as to shift a logic "1" when incrementing (i.e., shifting left) and the last latch stage SL(N) has its NEXTQ input port coupled to a fixed low logic level voltage, VSSA, so as to shift a logic "0" when decrementing (i.e., shifting right). This particular configuration is adapted to the desired function of a bi-directional shift register implemented within a DLL circuit application. In other words, the logic "0" is shifted from left to right in the shift register and the logic "1" is shifted in from right to left in the shift register.

It should be noted that in an alternative embodiment the logic "0" and "1" can be shifted from both directions. In this embodiment, instead of using PMOS and NMOS devices for M7 and M6 respectively, transmission gates controlled by the DEC and INC control signals can be used to pass the previous Q or next Q to the tri-state inverter input.

In another embodiment, the bi-directional shift register shown in FIG. 4 is implemented within a delay lock loop circuit. Hence, one embodiment of a DLL circuit in accordance with the present invention includes at least a delay unit circuit, a phase detector, and a bi-directional shift register. In this embodiment, the bi-directional shift register is implemented as shown in FIG. 4 using the single-latch circuits as shown in FIG. 2. The delay unit circuit in response to an external clock signal generates a delayed output clock signal corresponding to the external clock signal delayed by the amount of delay time established within the first delay unit circuit by a digital delay value stored within the bi-directional shift register. The phase detector detects any phase difference between the external clock signal and a feedback clock signal corresponding to the delayed output clock signal which has been fed back through the feedback path and generates right and left shift control signals for controlling the bi-directional register so as to adjust the delay value stored in the register to obtain a desired delay value. The bi-directional shift register includes a plurality of latching stages as described herein with regard to FIG. 4.

It should be noted that in conventional DLL circuits such as described in *A 256-Mb SDRAM Using a Register-Controlled Digital DLL,* by Atsushi Hatakeyama, et al., IEEE Journal of Solid-State Circuits, Vol. 32, No. 11 November 1997, pp. 1728–1732, at least two clock cycles are required to perform a DLL adjustment. In addition, adjustments are performed after several clock cycles due to the power consumed by the complex shift register and delay unit circuit design.

In the DLL circuit implemented with the single-latch circuit as shown in FIG. 2, the phase detector is clocked to provide the right and left shift control signals on the rising edge of the first half of the clock cycle of the system clock signal, and the tri-state inverter in each latch stage of the bi-directional shift register is clocked on the subsequent falling edge of the second half of the clock cycle such that a shift value adjustment can be obtained every clock cycle. Moreover, due to the simplification of the shift register, adjustments can be made every clock cycle since power consumption of the shift register is greatly reduced.

Although the components of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A single-latch circuit for sequentially coupling with a plurality of other single-latch circuits to form a shift register circuit, the shift register circuit being responsive to a first shift control signal and a second shift control signal, the single-latch circuit comprising:

an input circuit portion including a first MOS device, a second MOS device and an non-clocked first positive feedback loop circuit, the first MOS device having its gate coupled to the first shift control signal, its source coupled to output data from a previous latch circuit and its drain coupled to a first node and a second MOS device having its gate coupled to the second shift control signal, its source coupled to output data from a next latch circuit and its drain coupled to the first node;

a latching circuit portion including a clocked latching means and a second non-clocked positive feedback loop circuit, the latching circuit portion having its input coupled to the output of the first positive feedback loop circuit and its output coupled to the output of the single-latch circuit;

wherein during a first half cycle of a clock signal the first and second shift control signals enable one of the first and second MOS devices and the clocked latching means is disabled such that the output data from one of the next and previous latch circuit is driven on the first node which corresponds to a data value to be shifted and wherein the data value to be shifted is held on the output of the first positive feedback loop circuit; and wherein during the second half cycle of the clock signal the clocked latching means is enabled by the clock signal and the the first and second shift control signals disable the first and second MOS devices such that the latching circuit portion latches the data value to be shifted to the output of the single-latch circuit and wherein the second positive feedback loop holds the data value to be shifted to the output of the single-latch circuit during the first half of the next clock signal cycle.

2. The circuit as described in claim 1 wherein the first MOS device is a PMOS device and the second MOS device is a NMOS device.

3. The circuit as described in claim 1 wherein the first shift control signal corresponds to a left shift control signal and the second shift control signal corresponds to a right shift control signal.

4. The circuit as described in claim 1 further including a pre-set circuit portion for driving the first node and the output of the latching circuit portion to a high state regardless of the output data from the previous and next latch circuits.

5. The circuit as described in claim 1 further including a reset circuit portion for driving the first node and the output of the latching circuit portion to a low state regardless of the output data from the previous and next latch circuits.

6. The circuit as described in claim 1 wherein the first and second positive feedback circuits comprise first and second positive feedback inverter loops, respectively.

7. The circuit as described in claim 1 wherein the clocked latching means comprises a clocked tri-state inverter coupled to a system clock signal and the inverse of the system clock signal having its input coupled to the first node and its output coupled to the output of the single-latch circuit through an inverter.

8. A bi-directional shift register coupled to a first shift control signal, a second shift control signal, a system clock signal and the inverse of the system clock signal, the shift register comprising:

A plurality of latching stages each having a first input port for receiving the inverse of the first shift control signal, a second input port for receiving the second shift control signal, a third input port for receiving output data from a previous latching stage in the bi-directional shift register, a fourth input port for receiving output data from a next latching stage in the bi-directional shift register, a first clock input port for receiving the system clock signal, a second clock input port for receiving the inverse of the system clock signal, and an output port for outputting a shifted data value;

each latching stage comprising:

an input circuit portion including a first MOS device, a second MOS device and an non-clocked first positive feedback loop circuit, the first MOS device having its gate coupled to the first shift control signal, its source coupled to output data from a previous latch circuit and its drain coupled to a first node and a second MOS device having its gate coupled to the second shift control signal, its source coupled to output data from a next latch circuit and its drain coupled to the first node;

a latching circuit portion including a clocked latching means and a second non-clocked positive feedback loop circuit, the latching circuit portion having its input coupled to the output of the first positive feedback loop circuit and its output coupled to the output of the single-latch circuit;

wherein during a first half cycle of a clock signal the first and second shift control signals enable one of the first and second MOS devices and the clocked latching means is disabled such that the output data from one of the next and previous latch circuit is driven on the first node which corresponds to a data value to be shifted and wherein the data value to be shifted is held on the output of the first positive feedback loop circuit; and wherein during the second half cycle of the clock signal the clocked latching means is enabled by the clock signal and the the first and second shift control signals disable the first and second MOS devices such that the latching circuit portion latches the data value to be shifted to the output of the single-latch circuit and wherein the second positive feedback loop holds the data value to be shifted to the output of the single-latch circuit during the first half of the next clock signal cycle.

9. The circuit as described in claim 8 wherein the first MOS device is a PMOS device and the second MOS device is a NMOS device.

10. The circuit as described in claim 8 wherein the first shift control signal corresponds to a left shift control signal and the second shift control signal corresponds to a right shift control signal.

11. The circuit as described in claim 8 further including a pre-set circuit portion for driving the first node and the output of the latching circuit portion to a high state regardless of the output data from the previous and next latch circuits.

12. The circuit as described in claim 8 further including a reset circuit portion for driving the first node and the output of the latching circuit portion to a low state regardless of the output data from the previous and next latch circuits.

13. The circuit as described in claim 8 wherein the first and second positive feedback circuits comprise first and second positive feedback inverter loops, respectively.

14. The circuit as described in claim 8 wherein the clocked latching means comprises a tri-state inverter coupled to a system clock signal and the inverse of the system clock signal having its input coupled to the first node and its output coupled to the output of the single-latch circuit through an inverter.

15. A delay lock loop circuit for generating a delayed output clock signal comprising:

a delay unit circuit for generating the delayed output clock signal in response to a system clock signal, the delayed output clock signal corresponding to the system clock signal delayed by an amount of delay time established into the first delay unit circuit by a digital delay value;

a phase detector for detecting a phase difference between the external clock signal and a feedback clock signal corresponding to the delayed output clock signal, wherein dependent on the detected phase difference the phase detector generates right and left shift control signals;

a bi-directional shift register for storing the digital delay value and for adjusting the delay value in response to the right and left shift control signals, the bi-directional shift register including a plurality of latching stages, each stage including a single-latch circuit comprising:

an input circuit portion including a first MOS device, a second MOS device and an non-clocked first positive feedback loop circuit, the first MOS device having its gate coupled to the first shift control signal, its source coupled to output data from a previous latch circuit and its drain coupled to a first node and a second MOS device having its gate coupled to the second shift control signal, its source coupled to output data from a next latch circuit and its drain coupled to the first node;

a latching circuit portion including a clocked latching means and a second non-clocked positive feedback loop circuit, the latching circuit portion having its input coupled to the output of the first positive feedback loop circuit and its output coupled to the output of the single-latch circuit;

wherein during a first half cycle of a clock signal the first and second shift control signals enable one of the first and second MOS devices and the clocked latching means is disabled such that the output data from one of the next and previous latch circuit is driven on the first node which corresponds to a data value to be shifted and wherein the data value to be shifted is held on the output of the first positive feedback loop circuit; and wherein during the second half cycle of the clock signal the clocked latching means is enabled by the clock signal and the the first and second shift control signals disable the first and second MOS devices such that the latching circuit portion latches the data value to be shifted to the output of the single-latch circuit and wherein the second positive feedback loop holds the data value to be shifted to the output of the single-latch circuit during the first half of the next clock signal cycle.

16. The circuit as described in claim 15 wherein the first MOS device is a PMOS device and the second MOS device is a NMOS device.

17. The circuit as described in claim 15 further including a pre-set circuit portion for driving the first node and the output of the latching circuit portion to a high state regardless of the output data from the previous and next latch circuits.

18. The circuit as described in claim 15 further including a reset circuit portion for driving the first node and the output of the latching circuit portion to a low state regardless of the output data from the previous and next latch circuits.

19. The circuit as described in claim 15 wherein the first and second positive feedback circuits comprise first and second positive feedback inverter loops, respectively.

20. The circuit as described in claim 15 wherein the clocked latching means comprises a tri-state inverter coupled to a system clock signal and the inverse of the system clock signal having its input coupled to the first node and its output coupled to the output of the single-latch circuit through an inverter.

* * * * *